(12) United States Patent
Madadi et al.

(10) Patent No.: US 10,749,503 B2
(45) Date of Patent: Aug. 18, 2020

(54) DISCRETE TIME FILTER NETWORK

(71) Applicant: Qualinx B.V., Delft (NL)

(72) Inventors: Iman Madadi, Delft (NL); Massoud Tohidian, Delft (NL); Seyed Amir Reza Ahmadi Mehr, Delft (NL)

(73) Assignee: QUALINX B.V., Delft (NL)

( * ) Notice: Subject to any disclaimer, the term of this patent is extended or adjusted under 35 U.S.C. 154(b) by 69 days.

(21) Appl. No.: 16/239,213

(22) Filed: Jan. 3, 2019

(65) Prior Publication Data

US 2019/0140610 A1   May 9, 2019

Related U.S. Application Data

(63) Continuation-in-part of application No. PCT/NL2017/050441, filed on Jul. 4, 2017.
(Continued)

(30) Foreign Application Priority Data

Sep. 29, 2016 (NL) ..................... 2017551

(51) Int. Cl.
*H03H 19/00* (2006.01)
*H03H 1/00* (2006.01)

(52) U.S. Cl.
CPC ........ *H03H 19/004* (2013.01); *H03H 1/0007* (2013.01); *H03H 2001/0014* (2013.01)

(58) Field of Classification Search
CPC ............................ H03H 19/002; H03H 19/004
See application file for complete search history.

(56) References Cited

U.S. PATENT DOCUMENTS

| | | | | |
|---|---|---|---|---|
| 4,322,697 A | * | 3/1982 | Carbrey | H03H 19/004 327/554 |
| 6,061,279 A | * | 5/2000 | Toda | G11C 27/024 365/149 |

(Continued)

FOREIGN PATENT DOCUMENTS

WO   2018/009059   1/2018

OTHER PUBLICATIONS

Kitsunezuka, Masaki , et al., "A Low-IF/Zero-IF Reconfigurable Analog Baseband IC With an I/Q Imbalance Cancellation Scheme", IEEE Journal of Solid-State Circuits, vol. 46, No. 3, 2011, 572-582.
(Continued)

*Primary Examiner* — Dean O Takaoka
*Assistant Examiner* — Alan Wong
(74) *Attorney, Agent, or Firm* — Peacock Law P.C.; Janeen Vilven; Justin Muehlmeyer

(57) ABSTRACT

A discrete time filter network with an input signal connection and an output signal connection and comprising a capacitor bank with a plurality of history capacitors, and at least one sampling capacitor which operates at a predetermined cycling rate to couple to at least one history capacitor at a time, which history capacitor is selected from the capacitor bank so as to share electrical charge between such selected history capacitor and the sampling capacitor, wherein there is a plurality of sampling capacitors that are provided in the capacitor bank, and the discrete time filter network is provided with at least one switch network comprising a plurality of clock driven switches for making selected cyclical connections between the sampling capacitors and the history capacitors in the capacitor bank at the predetermined cycling rate.

6 Claims, 8 Drawing Sheets

Related U.S. Application Data

(60) Provisional application No. 62/358,080, filed on Jul. 4, 2016.

(56) References Cited

U.S. PATENT DOCUMENTS

| | | | | |
|---|---|---|---|---|
| 7,539,721 | B2* | 5/2009 | Belveze | H03H 15/00 708/819 |
| 7,664,811 | B2* | 2/2010 | Matsuoka | H03H 15/00 708/819 |
| 8,188,753 | B2* | 5/2012 | Nestler | G06F 17/14 324/658 |
| 8,390,370 | B2* | 3/2013 | Iida | H03H 19/004 327/552 |
| 8,456,335 | B2* | 6/2013 | Oshima | H03M 1/1052 341/118 |
| 8,717,094 | B2* | 5/2014 | Nestler | H03K 5/00 327/551 |
| 9,148,125 | B2 | 9/2015 | Tohidian et al. | |
| 2007/0030037 | A1* | 2/2007 | Wang | G11C 27/026 327/93 |
| 2010/0156560 | A1 | 6/2010 | Iida et al. | |

OTHER PUBLICATIONS

Madadi, Iman, et al., "A 65nm CMOS high-IF superheterodyne receiver with a High-Q complex BPF", 2013 IEEE Radio Frequency Integrated Circuits Symposium (RFIC), 2013, 323-326.

Madadi, Iman, "A High IIP2 SAW-Less Superheterodyne Receiver With Multistage Harmonic Rejection", IEEE Journal of Solid-State Circuits, vol. 51, No. 2, 2016, 332-347.

Madadi, Iman, et al., "A TDD/FDD SAW-less superheterodyne receiver with blocker-resilient band-pass filter and multi-stage HR in 28nm CMOS", 2015 Symposium on VLSI Circuits Digest of Technical Papers, 2015, C308-C309.

Manetti, S., "Passive Switched Capacitor Filters: General Biquad Topology", Electronics Letters, vol. 20, No. 2, 1984, 101-102.

Manetti, S., "Switch Ed-Capacitor Lowpass Filter Without Active Components", Electronics Letters, vol. 16, No. 23, 1980, 883-885.

Mirzaie, A., et al., "A 65nm CMOS Quad-Band SAW-Less Receiver for GSM/GPRS/EDGE", 2010 Symposium on VLSI Circuits/ Technical Digest of Technical Papers, 2010, 179-180.

Muhammad, K., "A Discrete-Time Bluetooth Receiver in a 0.13 mu/m Digital CMOS Process", ISSCC 2004 / Session 15 / Wireless Consumer ICs / 15.1, 2004, 268-270.

Muhammad, Khurram, et al., "The First Fully Integrated Quad-Band GSM/GPRS Receiver in a 90-nm Digital CMOS Process", IEEE Journal of Solid-State Circuits, vol. 41, No. 8, 2006, 1772-1783.

Murphy, David, et al., "A Noise-Cancelling Receiver with Enhanced Resilience to Harmonic Blockers", ISSCC 2014 / Session 3 / RF Techniques / 3.6, 2014, 68-70.

Tohidian, Massoud, et al., "A Fully Integrated Highly Reconfigurable Discrete-Time Super-Heterodyne Receiver", ISSCC 2014/Session3/ RF Techniques/3.8, 2014, 72-74.

Tohidian, Massoud, et al., "Analysis and Design of a High-Order Discrete-Time Passive IIR Low-Pass Filter", IEEE Journal of Solid-State Circuits, vol. 49, No. 11, 2014, 2575-2587.

* cited by examiner

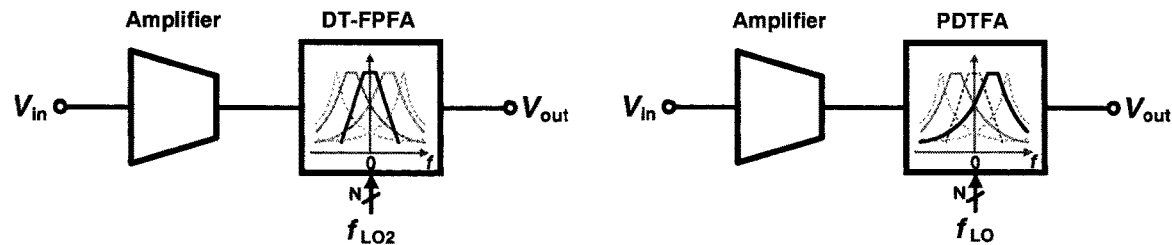
FIG. 1A  FIG. 1B
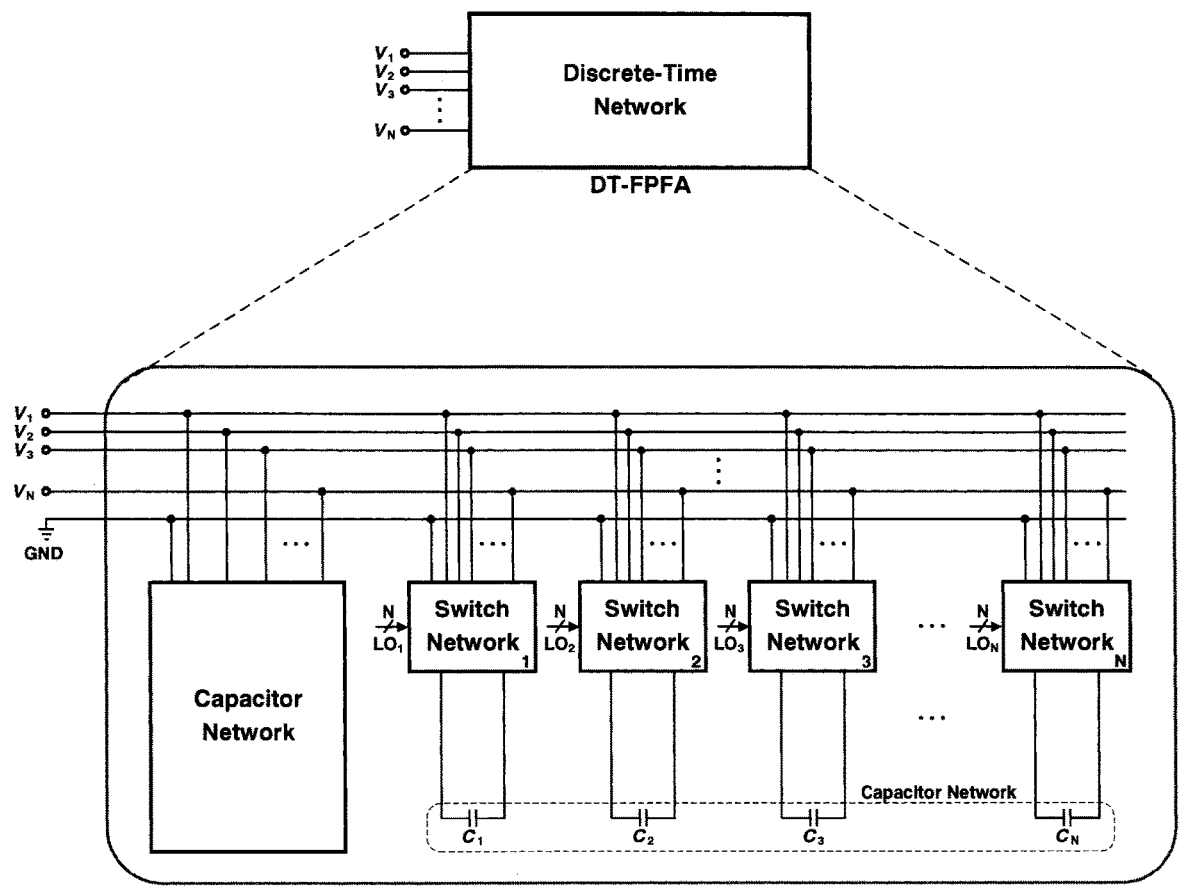
FIG. 2

$H(z) = b \cdot z^{-1}$
$G(z) = a \cdot z^{-1}$
$C_{H1} = C_{H2} = C_H$
$C_{S1} = C_{S2} = C_S$
$a = C_H/(C_H + C_S)$
$b = C_S/(C_H + C_S)$

DISCRETE TIME FILTER NETWORK

CROSS-REFERENCE TO RELATED APPLICATIONS

This application is a continuation-in-part application of International Application No. PCT/NL2017/050441, entitled "DISCRETE TIME FILTER NETWORK", filed on Jul. 4, 2017, which claims priority to and the benefit of Netherlands Application No. 2017551, entitled "DISCRETE TIME FILTER NETWORK" filed on Sep. 29, 2016, and U.S. Provisional Patent Application No. 62/358,080, entitled "DISCRETE-TIME FIELD PROGRAMMABLE FILTER ARRAY", filed Jul. 4, 2016, and the specification and claims thereof are incorporated herein by reference.

STATEMENT REGARDING FEDERALLY SPONSORED RESEARCH OR DEVELOPMENT

Not Applicable.

THE NAMES OF PARTIES TO A JOINT RESEARCH AGREEMENT

Not Applicable.

INCORPORATION BY REFERENCE OF MATERIAL SUBMITTED ON A COMPACT DISC

Not Applicable.

STATEMENT REGARDING PRIOR DISCLOSURES BY THE INVENTOR OR A JOINT INVENTOR

Not Applicable.

COPYRIGHTED MATERIAL

Not Applicable.

BACKGROUND OF THE INVENTION

Field of the Invention (Technical Field)

The invention relates to a discrete time filter network with an input signal connection and an output signal connection and comprising a capacitor bank with a plurality of history capacitors CHi ($i=1-N$) and a sampling capacitor or sampling capacitors CS which operate at a predetermined cycling rate to couple a sampling capacitor to at least one history capacitor CHi at a time, which history capacitor CHi and sampling capacitor CS are selected from the capacitor bank so as to share electrical charge between such selected history capacitor CHi and selected sampling capacitor CS of the capacitor hank. Such a discrete time filter network is known from U.S. Pat. No. 9,148,125, wherein the input signal connection feeds the history capacitors in the capacitor bank and the at least one sampling capacitor feeds the output signal connection.

The known discrete time filter network is provided with at least one switch network comprising a plurality of clock driven switches for making selected cyclical connections between the sampling capacitor or capacitors CS and the history capacitors CHi ($i=1-N$) in the capacitor hank at the predetermined cycling rate, wherein in any cycle and in accordance with the predetermined cycling rate one or more of the sampling capacitors CS are connected to the history capacitors CHi in the capacitor bank either parallel or antiparallel to transfer charge with positive and negative sign respectively, and wherein the antiparallel connection provides a negative feedback path.

Such a filter is known from "switched capacitor low-pass filter (LPF) without active components" published by S. Manetti and A. Liberatore and from "Passive Switched Capacitor Filters: General Biquad Topology" published by S. Manetti in 1984.

BRIEF SUMMARY OF THE INVENTION

One embodiment of the present invention provides for a discrete time filter network with an input connection and an output connection comprising a plurality of N history capacitors CHi ($i=1-N$), wherein $N \geq 3$, and wherein one of the plurality of history capacitors CHi is connected to the input connection and another one of the plurality of history capacitors CHi is connected to the output connection. At least one sampling capacitor CS which is coupled either parallel or antiparallel to one of the plurality of history capacitors CHi at a time to share electrical charge with positive and negative sign respectively, wherein the antiparallel connection provides a negative feedback path. A switch network comprising a plurality of clock driven switches for making a predetermined sequential cyclical connection between the at least one sampling capacitor CS and the history capacitors CHi ($i=1-N$) at a predetermined cycling rate characterized in that the discrete time filter network comprises a predefined number M of feedback paths, wherein $M \geq 1$, the location of which is identified with a predefined list L of M feedback location numbers wherein each location number Lj ($j=1-M$) ranges from 2 to N and defines the feedback path of the history capacitor Chi to the input, wherein i ranges from $i=1$ to Lj, and is associated with a sub-cycle j within the predetermined cycling rate, and that in each sub-cycle j ($j=1-M$), the at least one sampling capacitor CS is connected sequentially parallel to each history capacitor CHi wherein i ranges from $i=1$ to Lj, and that upon reaching and connecting to a history capacitor CHi, wherein $i=Lj$, the at least one sampling capacitor CS is subsequently flipped and connected back antiparallel so as to provide its charge with inverted polarity to the history capacitor CHi, wherein $i=1$.

In one embodiment the filter network is characterized in that a current is provided to the input connection.

In another embodiment of the filter network a charge is provided to the input connection.

In another embodiment the filter network is characterized in that a plurality of sampling capacitors are sequentially, i.e. with mutual phase-delay, connected to the history capacitors. In another embodiment, the filter network is characterized in that the network is embodied without active components.

In another network, the filter network is characterized in that at east one of the numbers in said list L of M feedback location numbers pertaining to the history capacitors CHi is equal to the number N of history capacitors.

According to the invention a discrete time filter network is proposed having the features of one or more of the appended claims.

US2010/156560 discloses a discrete time filter network according to the preamble of claim 1.

The invention provides a discrete time filter network with an input connection and an output connection comprising:

a plurality of N history capacitors CHi (i=1–N), wherein N≥3, and wherein one of the plurality of history capacitors CHi is connected to the input connection and another one of the plurality of history capacitors CHi is connected to the output connection, at least one sampling capacitor CS which is coupled either parallel or antiparallel to one of the plurality of history capacitors CHi at a time to share electrical charge with positive and negative sign respectively, wherein the antiparallel connection provides a negative feedback path, and a switch network comprising a plurality of clock driven switches for making a predetermined sequential cyclical connection between the at least one sampling capacitor CS and the history capacitors CHi (i=1–N) at a predetermined cycling rate;

wherein the discrete time filter network comprises a predefined number M of feedback paths, wherein M≥1, the location of which is identified with a predefined list L of M feedback location numbers wherein each location number Lj (j=1–M) ranges from 2 to N and defines the feedback path of the history capacitor Chi to the input, wherein i ranges from i=1 to Lj, and is associated with a sub-cycle j within the predetermined cycling rate, and that in each sub-cycle j (j=1–M), the at least one sampling capacitor CS is connected sequentially parallel to each history capacitor CHi wherein i ranges from i=1 to Lj, and that upon reaching and connecting to a history capacitor CHi, wherein i=Lj, the at least one sampling capacitor CS is subsequently flipped and connected back antiparallel so as to provide its charge with inverted polarity to the history capacitor CHi, wherein i=1.

Suitably either a voltage, current or a charge can be provided to the input connection.

Speed of operation of the filter network can be increased by arranging that a plurality of sampling capacitors are sequentially, that is with mutual phase delay, connected to the history capacitors.

It is preferred that the network is embodied without active components. This limits energy consumption.

At least one of the numbers in the above-mentioned list L of M feedback location numbers pertaining to the history capacitors CHi is equal to the number N of history capacitors.

Filters are widely used in analog and radio-frequency (RF) circuits to select the wanted RF signal and reject interferers and blockers to avoid saturation of internal nodes in the receiver chain. The discrete-time (DT) field programmable filter array (DT-FPFA) of the invention is a fully configurable and reconfigurable passive DT filter, comprising only transistors as switches, and capacitors. Its power consumption is accordingly low compared to other filters such as RC, LC, and opamp-based bi-quad filters. Further the filter characteristics of the network of the invention closely match theoretical filter characteristics.

Preferably the clock driven switches of the switch network are toggled in a predetermined order to make a selected sequence of connections between the sampling capacitors and the history capacitors in the capacitor bank. This promotes the possibility to realize any existing type of filter network.

Further objects of the invention are promoted by arranging that the switches in the switch network are driven in a predetermined sequence and at a predetermined cycling rate to provide one of a low pass filter, a bandpass filter, and a high pass filter between the input signal connection and the output signal connection.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings:

FIG. 1A-B shows a block diagram of (a) a zero-IF and (b) a Superheterodyne receiver front-end including a discrete-time (DT) field programmable filter array (DT-FPFA) after a gain stage amplifier.

FIG. 2 shows a top-level block diagram of a programmable discrete-time filter array (DT-FPFA) comprises switches and capacitors.

Whenever in the figures the same reference numerals are applied, these numerals refer to the same parts.

DETAILED DESCRIPTION OF THE INVENTION

As shown in FIG. 1, the proposed DT-FPFA of the invention can be utilized in any receiver (RX) such as zero-IF or high-IF/Superheterodyne to simultaneously keep the interested radio-frequency (RF) signal and reject blockers/interferers.

Since the proposed DT filter is completely passive, it is fully reconfigurable and process-scalable. The type, bandwidth and order of the filter can be changed arbitrary by capacitor-ratio, local oscillator (LO) frequency and clock waveform scheme. The type of filter can be any type of low-pass (LP) or band-pass (BP) by choosing a proper clock waveform scheme driving filter's switches. The power consumption of the DT-FPFA is mainly for driving the LO switches, therefore like any digital block, the power consumption of the filter scales over time with Moore's law by moving from older technology to newer ones.

As shown in FIG. 2, the DT-FPFA comprises one or more switch networks, a first group of input/output signal lines interconnecting the switch networks and other blocks, a first network of capacitors connecting to input/output lines, a second network of capacitors connecting to the switch networks and a group of signal lines as clocks driving switches to provide a discrete-time field programmable filter array capable of realizing a low-pass or band-pass filter.

The invention is applicable to all types of architectures such as zero-/low-IF or homodyne, that are widely used in both academic and industrial receivers [1]-[5] due to their simple architecture and easy integration of RC LPFs in CMOS. The invention addresses several issues associated with zero-/low-IF architecture, to meet an increasing demand to utilize Superheterodyne architecture in fully integrated receivers [6]-[9]. In all of the above-mentioned architectures one of the key building blocks is the filtering block, which can be either LPF for zero-/low-IF or BPF for Superheterodyne architecture.

Figure 3A:
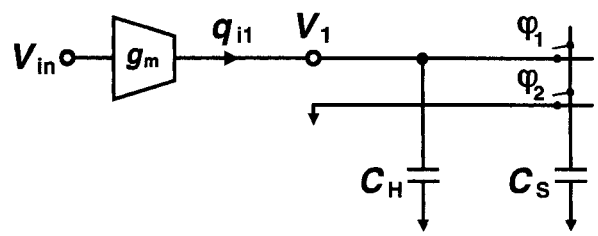
FIG. 3A-C shows (a) a 1st-order discrete-time IIR, (b) its clock diagram and (c) its equivalent z-domain charge signal flow graph (SFG).
Figure 3B:
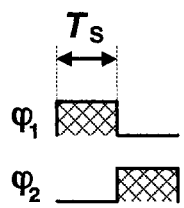
Figure 3C:
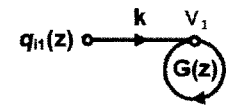
Figure 4A:
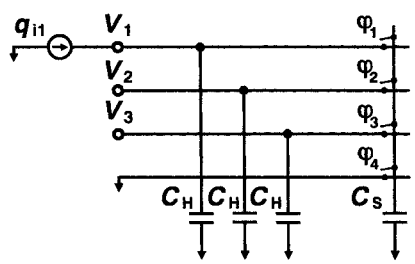
FIG. 4A-C shows (a) a 3rd-order discrete-time IIR LPF with real poles, (b) its clock diagram and (c) its equivalent z-domain charge signal flow graph (SFG).
Figure 4B:
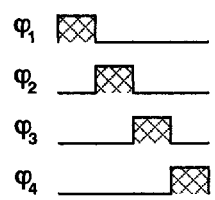
Figure 4C:
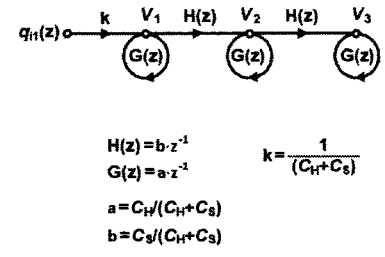
Figure 5A:
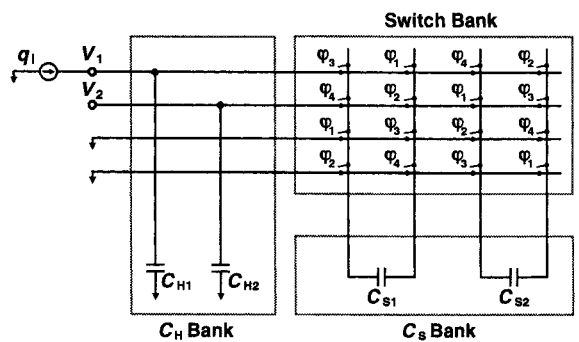
FIG. 5A-D shows (a) the 2nd-order single-ended biquad LPF with additional pipelining Cs to increase sample rate, (b) its equivalent fully differential schematic, (c) its equivalent z-domain signal flow graph and (d) its LO clock waveform scheme presented in [11].
Figure 5B:
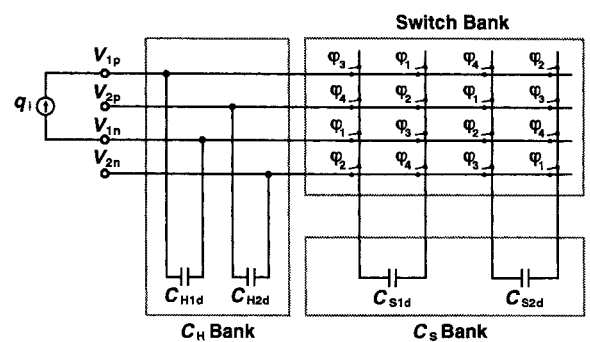
Figure 5C:
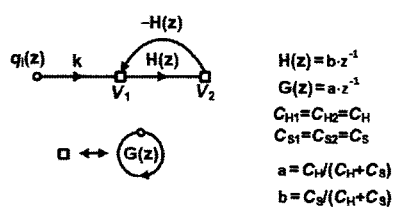
Figure 5D:
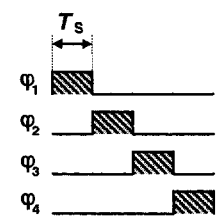

A simple prior art charge sampling 1st-order DT IIR is shown in FIG. 3 comprising only switches and capacitors. As shown in FIG. 3($a$), the input charge $q_{i1}=\int I_{in}(t)dt$ integrates over time slot $T_S$, where the input current, $I_{in}=g_m \times V_{in}$ (provided by gm-cell or low-noise transconductance amplifier). In $\varphi_1$, sampling capacitor CS takes a portion of the charge stored on history capacitor CH, and in the next phase, $\varphi_2$, the charge on CS is delivered to ground. The CS acts as a discrete-time resistor that together with CH forms a 1st-order low-pass IIR filter. The equivalent DT resistor of CS is $R_{DT}=1/(CS \times f_S)$, where $f_S=1/T_S$ is the sampling frequency of the filter. As shown in FIG. 4, the order of filtering can in accordance with the prior art be increased further to three by sharing the charge of CS with two other history capacitors before it gets reset [10].

In comparison with the prior art the invention aims to provide a new class of low-pass and band-pass filters with enhanced and sharper transfer function compared to IIR filters.

Another object of invention is to generalize the idea to a discrete-time field programmable filter array capable of realizing not only simple IIR filters but also any kind of higher order low-pass filter with complex poles by just adjusting a clock waveform scheme.

Discrete-Time Passive Low-Pass Filters (LPFs)

As shown in both FIG. 3($c$) and FIG. 4($c$), signal flow graph (SFG) of prior art IIR filters contain only feed-forward paths from one node to the next node and there is no feedback in SFGs except for some self-feedbacks in some nodes which are due to an integration of current in each capacitor. The DT IIR filters presented in FIG. 3 and FIG. 4 consist only real poles. As a consequence, there is a smooth transition between a passband and roll-off of filters.

The first improvement can be achieved by an introducing fully discrete-time negative feedback in filter's SFG between output node to the input node which generate a complex pole in a filter's SFG. As a result, the transition between filter's passband and roll-off improves. This idea of negative feedback from output to the input for fully passive DT filter as shown in FIG. 5 was published in "switched capacitor low-pass filter (LPF) without active components" [11] by S. Manetti and A. Liberatore. It should be noted that the transfer function of filter in FIG. 5 completely matches with 2nd-order biquad transfer function.

Figure 6:
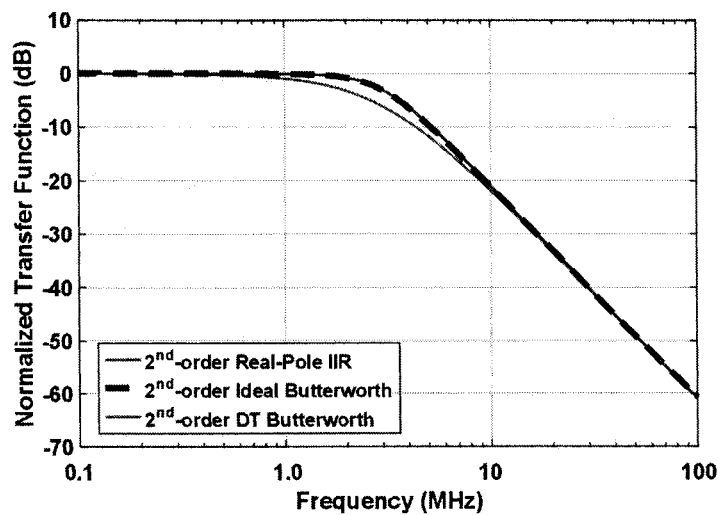
FIG. 6 shows transfer function comparison of DT 2nd-order biquad filter with ideal Butterworth and real-pole IIR.

The single-ended circuit schematic of a 2nd-order biquad LPF with negative feedback is shown in FIG. 5($a$). In $\varphi 1$, $C_{S1}$ takes a portion of charge stored on $C_{H1}$. In the next phase, $\varphi 2$, it simultaneously delivers the previous charge to $C_{H2}$ while again takes a portion of $C_{H2}$'s charge. In $\varphi 3$, it transfers stored charge back to $C_{H1}$, but with a negative sign, and so on. To summarize the operation of this filter, as also its SFG shows in FIG. 5($c$), the charge transfer is always with a positive sign from $V_1$ to $V_2$ and with a negative sign from $V_2$ to $V_1$. The equivalent fully differential circuit of the LPF is also shown in FIG. 5($b$) where $C_{H1d}=C_{H1}$, $C_{H2d}=C_{H2}$, $C_{S1d}=C_{S1}/2$, and $C_{S2d}=C_{S2}/2$. The negative feedback in this circuit is achieved by flipping the sampling capacitors, $C_{s1d}$ and $C_{s2d}$, when it goes from differential $V_2=V_{2p}-V_{2n}$ to $V_1=V_{1p}-V_{1n}$. The filter characteristic of the circuit is fully programmable, for instance bandwidth (BW) of the filter is set by a ratio of $CS/C_H$ and $f_S$ making it less sensitive to capacitor mismatches and PVT variation. A simulated transfer function of DT 2nd-order biquad are compared with an ideal Butterworth and real-pole IIR filters in FIG. 6, which CS, $C_H$ and $f_S$ are 7.5 fF, 2.7 pF and 4.4 GHz, respectively, for 2nd-order filter.

Figure 7:
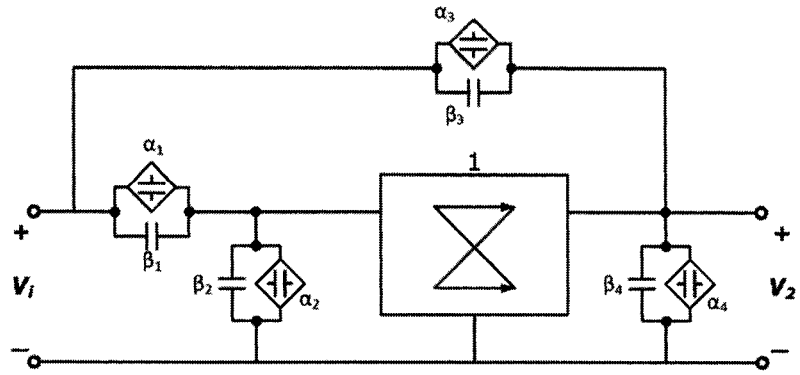
FIG. 7 shows the general idea of biquad topology proposed in [12].

Furthermore, shown in FIG. 7, general idea of 2nd-order passive DT biquad filter was published in "Passive Switched Capacitor Filters: General Biquad Topology" [12] by S. Manetti in 1984. The different LPF, BPF and HPF transfer functions can be achieved by adjusting the filter coefficients as fully described in [12].

Figure 8:
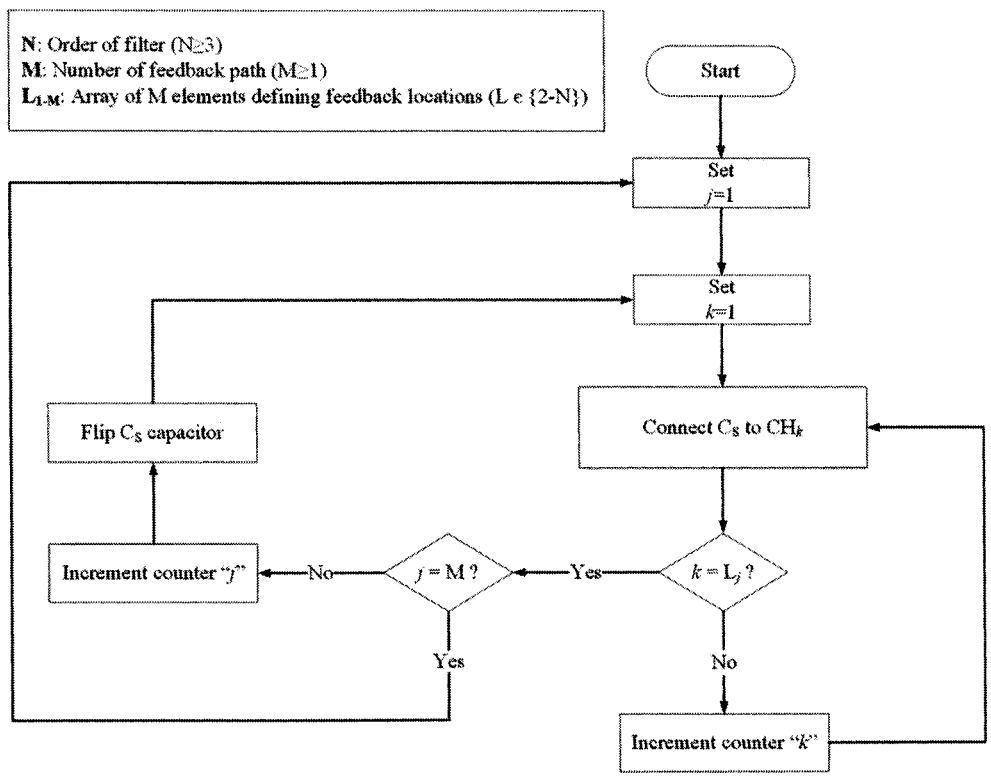
FIG. 8 shows general operation of filter with multiple DT negative feedback.

The general idea of this invention is about a DT filter with one or multiple negative feedback paths as the operation of such a filter is fully shown in FIG. 8. An order of a filter (N≥3), number of feedback paths M≥1, and list L of M numbers defining feedback locations ($L_1$-$L_M$) are pre-defined parameters. A general flow is that a sampling capacitor, CS, connects sequentially to every $CH_i$ and whenever it reaches to any i listed in $L_1$-$L_M$, then it will be flipped and connect back to $CH_1$. This process will continue until it reaches to the end list of $L_M$, then it will continue from the beginning. To clarify more, some example of proposed filter is mentioned below.

Figure 9A:
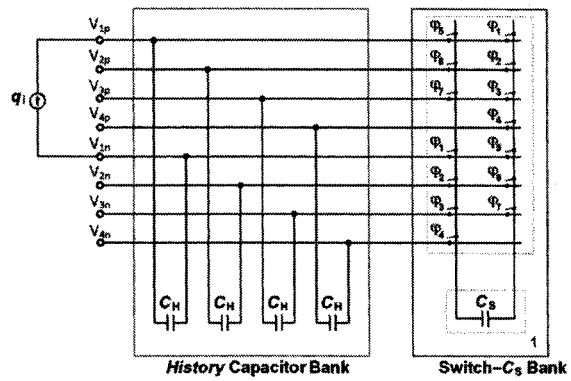
FIG. 9A-D shows (a) a 4th-order differential DT LPF when N=4, M=2, L=[3, 4], (b) its equivalent full-rate schematic, (c) its equivalent z-domain charge signal flow graph (SFG) and (d) its 7× LO clock waveform scheme.
Figure 9B:
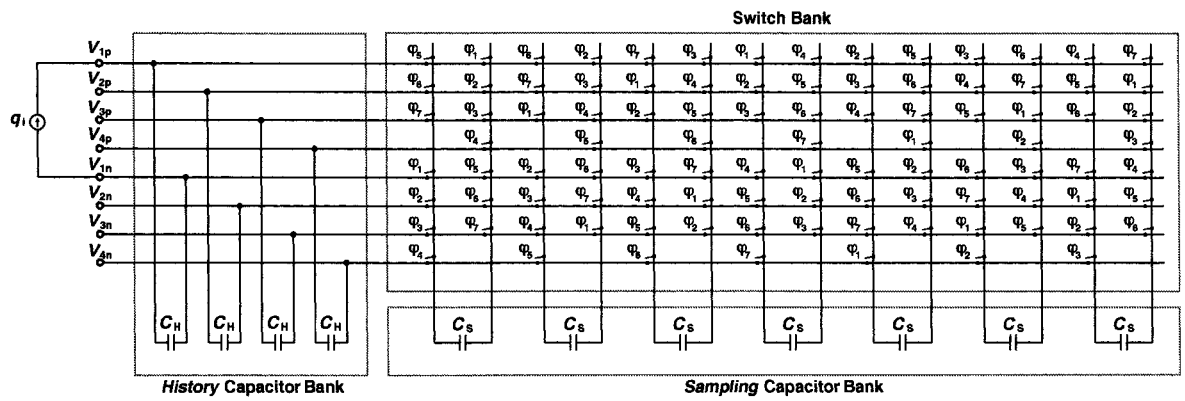
Figure 9C:
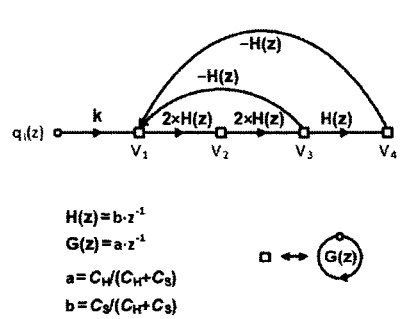
Figure 9D:
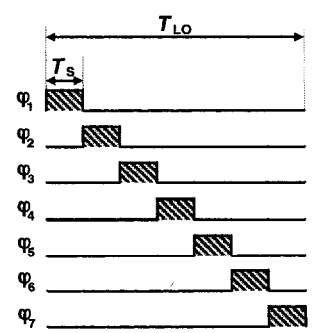
Figure 10:
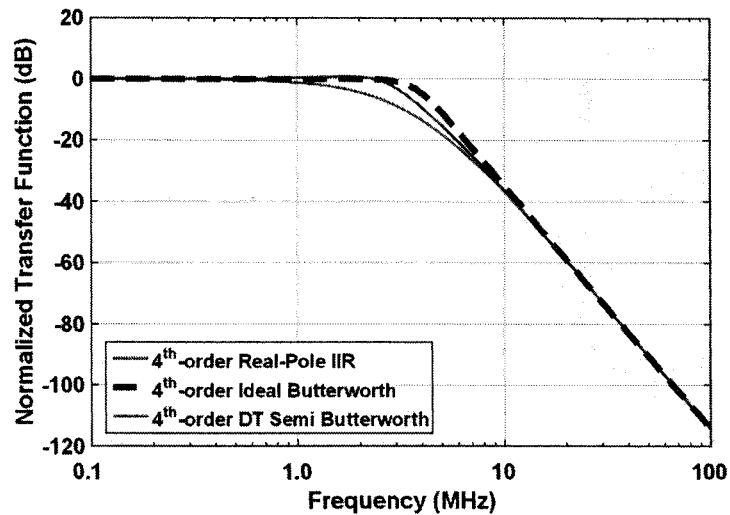
FIG. 10 shows a transfer function comparison of DT 4th-order filter of FIG. 9 with ideal Butterworth and real-pole IIR.

DT filter (N=4, M=2, L=[3, 4]): A general DT 2nd-order biquad topology was proposed in [12], but the order of the filter is limited to second, which makes the filter less efficient in face of large blockers. The order of the filter can be further improved to 4th-order LPF when N=4, M=2, and L=[3, 4], without any active component as shown in FIG. 9. Since the circuit in this embodiment is fully differential, the input integrated current, qi, is injected differentially to $V_{1p}$ and $V_{1n}$. The input/output differential voltages are defined as $V_1=V_{1p}-V_{1n}$, $V_2=V_{2p}-V_{2n}$, $V_3=V_{3p}-V_{3n}$ and $V_4=V_{4p}-V_{4n}$. The charge transfer signal flow graph (SFG) of this filter between different nodes is shown in FIG. 9($c$). Since N=4, M=2, and L=[3, 4], it means that the filter's order is 4th and there are two feedbacks (M=2) from 3rd and 4th history capacitors ("specified in L") to the input. The differential CS capacitor, samples from 4 differential $C_H$ and rotate the charge between history capacitors. But, when it will reach to an output specified in the L matrix, the CS capacitor flips and connects back to the input. Since the CS capacitor is flipped from $V_3$ and $V_4$, then the charge SFG shown in FIG. 9(c) is comprised of two negative feedbacks from $V_3$ and $V_4$ to $V_1$. FIG. 9(b) is a schematic view of FIG. 9(a) when multiple CS are used in parallel with phase delay to increase the sampling frequency. The clock waveforms driving all switches are shown in FIG. 9(d). Since the $4^{th}$-order DT LPF operates in a full-rate mode [10], the sampling frequency, $f_S=1/T_S$, is equal to $7 \times f_{LO}$ while $f_{LO}=1/T_{LO}$. A simulated transfer function of the DT 4th-order filter is compared with an ideal Butterworth and real-pole IIR filters in FIG. 10, which CS, $C_H$, and $f_S$ are 7.5 fF, 5.4 pF, and 4.2 GHz, respectively.

Figure 11:
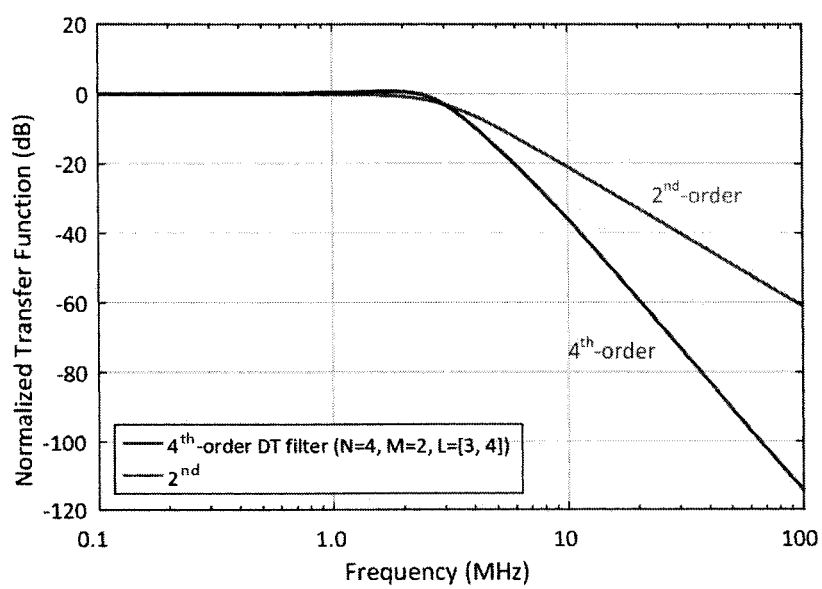
FIG. 11 shows a transfer function comparison of a DT 2nd-order Butterworth filter with the DT 4th-order IIR filter of FIG. 9 with complex poles (N=4, M=2, L=[3,4]).

Shown in FIG. 11, the simulated transfer function of a DT 2nd-order biquad (Butterworth) is also compared with a DT 4th-order filter. The order of filtering is improved from 2 to 4 with DT techniques without using any active components. Hence, the noise and linearity of the proposed filters are much superior to other type of filters like Gm–C, active RC, opamp based biquad filters. Also, its power consumption is reduced significantly by removing active parts.

Figure 12A:
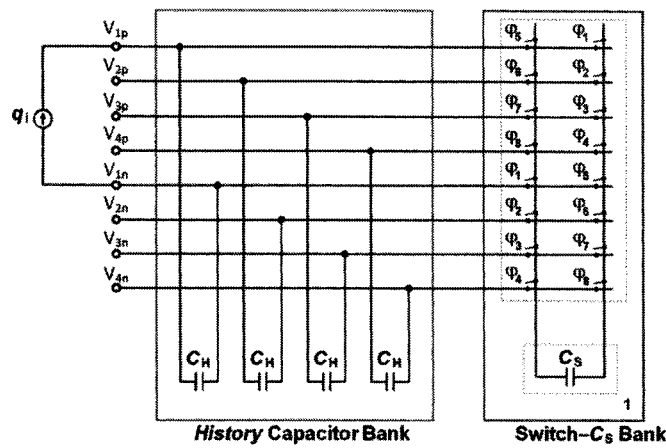
FIG. 12A-D shows (a) The 4th-order DT LPF when N=4, M=1, L=[4], (b) its equivalent full-rate schematic, (c) its equivalent z-domain charge signal flow graph (SFG) and (d) its 8× LO clock waveform scheme.
Figure 12B:
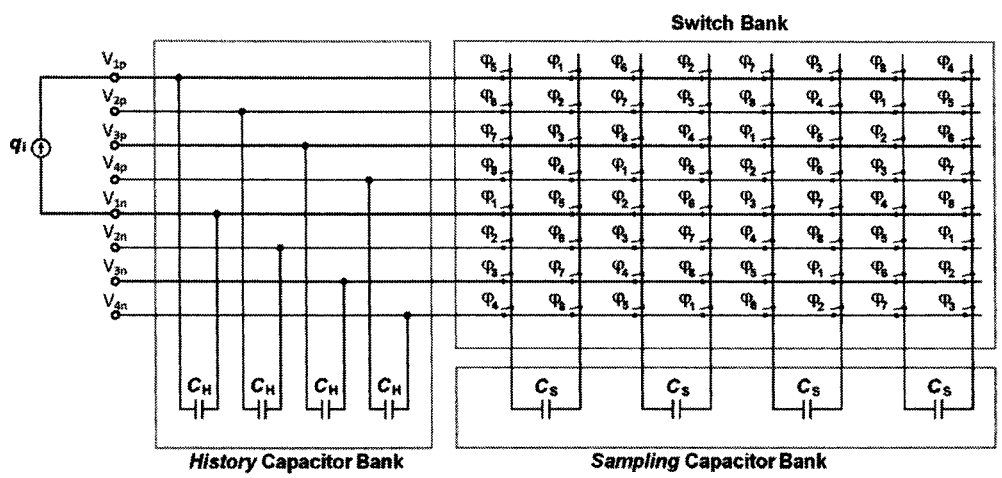
Figure 12C:
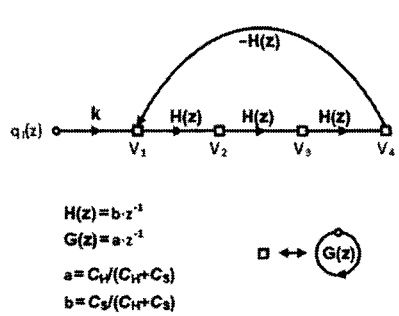
Figure 12D:
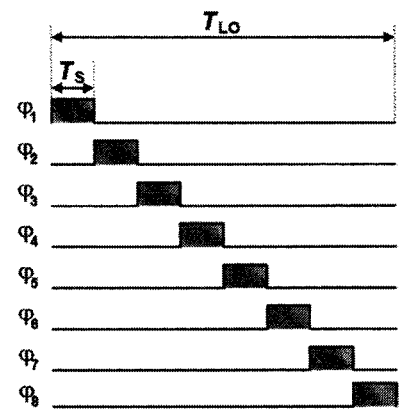
Figure 13:
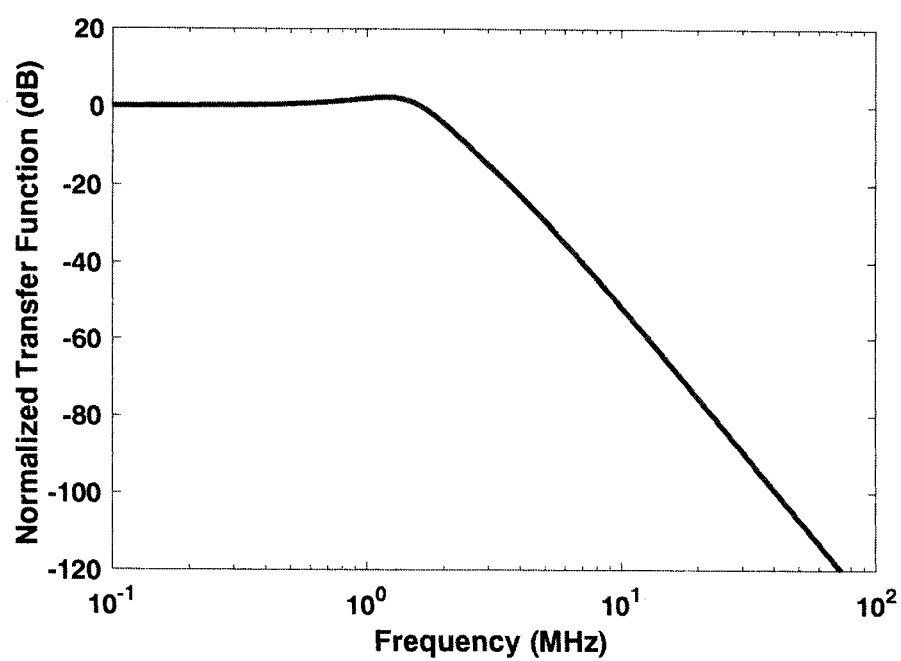
FIG. 13 shows transfer function DT 4th-order filter when N=4, M=1, L=[4].

DT filter (N=4, M=1, L=[4]): Another example of such a general filter is when N=4, M=1, and L=[4]. So, it means that the filter's order is 4th and there is only one feedback from the 4th output to the input. The circuit schematic of such a filter is shown in FIG. 12(a). The sampling frequency of the circuit could be increased by increasing the number of sampling capacitors as shown in FIG. 12(b). Also, the equivalent SFG of the filter is shown in FIG. 12(c) as well as a clock scheme of the filter in FIG. 12(d). The normalized transfer function of the filter is also shown in FIG. 13, which CS, $C_H$, and $f_S$ are 7.5 fF, 5.4 pF, and 4.2 GHz, respectively.

Although the invention has been discussed in the foregoing with reference to exemplary embodiments of the filter network of the invention, the invention is not restricted to these particular embodiments which can be varied in many ways without departing from the invention. The discussed exemplary embodiments shall therefore not be used to construe the appended claims strictly in accordance therewith. On the contrary the embodiment is merely intended to explain the wording of the appended claims without intent to limit the claims to these exemplary embodiments. The scope of protection of the invention shall therefore be construed in accordance with the appended claims only, wherein a possible ambiguity in the wording of the claims shall be resolved using these exemplary embodiments.

In at least one embodiment, and as readily understood by one of ordinary skill in the art, the apparatus according to the invention will include a general or specific purpose computer or distributed system programmed with computer software implementing the steps described above, which computer software may be in any appropriate computer language, including C++, FORTRAN, BASIC, Java, assembly language, microcode, distributed programming languages, etc. The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements.

that in the specification and claims, "about" or "approximately" means within twenty percent (20%) of the numerical amount cited. All computer software disclosed herein may be embodied on any computer-readable medium (including combinations of mediums), including without limitation CD-ROMs, DVD-ROMs, hard drives (local or network storage device), USB keys, other removable drives, ROM, and firmware.

Although the invention has been described in detail with particular reference to these embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

REFERENCES

[1] M. Kitsunezuka, T. Tokairin, T. Maeda, and M. Fukaishi, "A low-IF/Zero-IF reconfigurable analog baseband ic with an I/Q imbalance cancellation scheme," IEEE J. Solid-State Circuits, vol. 46, no. 3, pp. 572-582, 2011.

[2] D. Murphy, H. Darabi, and H. Xu, "A noise-cancelling receiver with enhanced resilience to harmonic blockers," in Digest of Technical Papers—IEEE International Solid-State Circuits Conference, 2014, vol. 57, pp. 68-69.

[3] K. Muhammad, D. Leipold, B. Staszewski, Y.-C. Ho, C. M. Hung, K. Maggio, C. Fernando, T. Jung, J. Wallberg, J.-S. Koh, S. John, I. Deng, O. Moreira, R. Staszewski, R. Katz, and O. Friedman, "A discrete-time Bluetooth receiver in a 0.13&mu;m digital CMOS process," in 2004 IEEE International Solid-State Circuits Conference (IEEE Cat. No.04CH37519), 2004, pp. 268-527.

[4] a Mirzaie, A. Yazdi, Z. Zhou, E. Chang, P. Suri, H. Darabi, and B. Corporation, "A 65 nm CMOS Quad-Band SAW-Less Receiver for GSM/GPRS/EDGE," in VLSI, 2010, no. 949, pp. 179-180.

[5] K. Muhammad, Y. Ho, T. L. Mayhugh, C. Hung, T. Jung, I. Elahi, C. Lin, I. Y. Deng, C. Fernando, J. L. Wallberg, S. K. Vemulapalli, S. Larson, T. Murphy, D. Leipold, P. Cruise, J. Jaehnig, M. Lee, R. B. Staszewski, S. Member, R. Staszewski, and K. Maggio, "The First Fully Integrated Quad-Band GSM/GPRS Receiver in a 90-nm Digital CMOS Process," vol. 41, no. 8, pp. 1772-1783, 2006.

[6] M. Tohidian, I. Madadi, and R. B. Staszewski, "A fully integrated highly reconfigurable discrete-time superheterodyne receiver," in 2014 IEEE International Solid-State Circuits Conference Digest of Technical Papers (ISSCC), 2014, pp. 72-74.

[7] I. Madadi, M. Tohidian, and R. B. Staszewski, "A 65 nm CMOS high-IF superheterodyne receiver with a High-Q complex BPF," in 2013 IEEE Radio Frequency Integrated Circuits Symposium (RFIC), 2013, pp. 323-326.

[8] I. Madadi, M. Tohidian, K. Cornelissens, P. Vandenameele, and R. B. Staszewski, "A TDD/FDD SAW-less superheterodyne receiver with blocker-resilient band-pass filter and multi-stage HR in 28 nm CMOS," in 2015 Symposium on VLSI Circuits (VLSI Circuits), 2015, pp. C308-C309.

[9] I. Madadi, M. Tohidian, K. Cornelissens, P. Vandenameele, and R. B. Staszewski, "A High IIP2 SAW-Less Superheterodyne Receiver With Multistage Harmonic Rejection," IEEE J. Solid-State Circuits, vol. 51, no. 2, pp. 332-347, 2016.

[10] M. Tohidian, I. Madadi, and R. B. Staszewski, "Analysis and Design of a High-Order Discrete-Time Passive IIR Low-Pass Filter," IEEE J. Solid-State Circuits, vol. 49, no. 11, pp. 2575-2587, 2014.

[11] S. Manetti and A. Liberatore, "Switched-capacitor lowpass filter without active components," Electron. Lett., vol. 16, no. 23, p. 883, 1980.

[12] S. Manetti, "Passive switched capacitor filters: general biquad topology," Electron. Lett., vol. 20, no. 2, p. 101, 1984.

The invention claimed is:

1. A discrete time filter network with an input connection and an output connection comprising:

a plurality of N history capacitors CHi (i=1−N), wherein N≥3, and wherein one of the plurality of history capacitors CHi is connected to the input connection and another one of the plurality of history capacitors CHi is connected to the output connection, at least one sampling capacitor CS which is coupled either parallel or antiparallel to one of the plurality of history capacitors CHi at a time to share electrical charge with positive and negative sign respectively, wherein the antiparallel connection provides a negative feedback path, and a switch network comprising a plurality of clock driven switches for making a predetermined sequential cyclical connection between the at least one sampling capacitor CS and the history capacitors CHi (i=1−N) at a predetermined cycling rate;

characterized in that the discrete time filter network comprises a predefined number M of feedback paths, wherein M≥1, the location of which is identified with a predefined list L of M feedback location numbers wherein each location number Lj (j=1−M) ranges from 2 to N and defines the feedback path of the history capacitor CHi to the input, wherein i ranges from i=1 to Lj, and is associated with a sub-cycle j within the predetermined cycling rate, and that in each sub-cycle j (j=1−M), the at least one sampling capacitor CS is connected sequentially parallel to each history capacitor CHi wherein i ranges from i=1 to Lj, and that upon reaching and connecting to a history capacitor CHi, wherein i=Lj, the at least one sampling capacitor CS is subsequently flipped and connected back antiparallel so as to provide its charge with inverted polarity to the history capacitor CHi, wherein i=1.

2. The filter network of claim 1, characterized in that a current is provided to the input connection.

3. The filter network of claim 1, characterized in that a charge is provided to the input connection.

4. The filter network according to claim 1, characterized in that a plurality of sampling capacitors are sequentially, i.e. with mutual phase-delay, connected to the history capacitors.

5. The filter network of claim 1, characterized in that the network is embodied without active components.

6. The filter network of claim 1, characterized in that at least one of the numbers in said list L of M feedback location numbers pertaining to the history capacitors CHi is equal to the number N of history capacitors.

* * * * *